(12) United States Patent
Soda et al.

(10) Patent No.: US 8,658,342 B2
(45) Date of Patent: Feb. 25, 2014

(54) PHOTOSENSITIVE COMPOSITION INCLUDING PHOTOPOLYMERIZABLE POLYMER HAVING FLUORENE SKELETON

(75) Inventors: Hiroyuki Soda, Funabashi (JP); Takahiro Sakaguchi, Funabashi (JP); Shojiro Yukawa, Funabashi (JP)

(73) Assignee: Nissan Chemicals Industries, Ltd., Tokyo (JP)

( * ) Notice: Subject to any disclaimer, the term of this patent is extended or adjusted under 35 U.S.C. 154(b) by 159 days.

(21) Appl. No.: 13/266,589

(22) PCT Filed: Apr. 20, 2010

(86) PCT No.: PCT/JP2010/057000
§ 371 (c)(1), (2), (4) Date: Oct. 27, 2011

(87) PCT Pub. No.: WO2010/125949
PCT Pub. Date: Nov. 4, 2010

(65) Prior Publication Data
US 2012/0129102 A1    May 24, 2012

(30) Foreign Application Priority Data
Apr. 27, 2009    (JP) .................................. 2009-108223

(51) Int. Cl.
*G03C 1/00* (2006.01)
*G03F 7/00* (2006.01)

(52) U.S. Cl.
USPC ...................... 430/270.1; 430/286.1; 430/321

(58) Field of Classification Search
USPC ............. 430/7, 270.1, 311, 285.1, 286.1, 321
See application file for complete search history.

(56) References Cited

U.S. PATENT DOCUMENTS

| | | | |
|---|---|---|---|
| 2003/0176010 A1* | 9/2003 | Kim | 438/70 |
| 2005/0242271 A1* | 11/2005 | Weng et al. | 250/214.1 |
| 2005/0280754 A1* | 12/2005 | Kume et al. | 349/106 |
| 2008/0220372 A1 | 9/2008 | Lee et al. | |
| 2008/0224136 A1* | 9/2008 | Wang et al. | 257/53 |

FOREIGN PATENT DOCUMENTS

| | | |
|---|---|---|
| JP | A-06-220131 | 8/1994 |
| JP | A-2002-265840 | 9/2002 |
| JP | 2003176343 A * | 6/2003 |
| JP | A-2003-165830 | 6/2003 |
| JP | A-2003-176343 | 6/2003 |
| JP | A-2004-35685 | 2/2004 |
| JP | A-2006-3860 | 1/2006 |
| JP | A-2006-259716 | 9/2006 |
| JP | A-2008-52249 | 3/2008 |
| WO | WO 03/081344 A1 | 10/2003 |

OTHER PUBLICATIONS

English Translation of JP-2003176343A.*
Written Opinion dated Jun. 1, 2010 issued in International Application No. PCT/JP2010/057000 (with translation).
International Search Report dated Jun. 1, 2010 issued in International Application No. PCT/JP2010/057000 (with translation).

* cited by examiner

*Primary Examiner* — Stewart Fraser
(74) *Attorney, Agent, or Firm* — Oliff PLC

(57) ABSTRACT

A material for a planarization film, a spacer, and a microlens that satisfies heat resistance and transparency requirements without impairing a refractive index. A negative photosensitive composition includes a photopolymerizable polymer (A) having a fluorene skeleton, a monomer (B) having a fluorene skeleton and a photopolymerization initiator (C). The photopolymerizable polymer (A) having a fluorene skeleton may include a moiety that is soluble in an alkaline developer solution, or a unit structure of Formula (1):

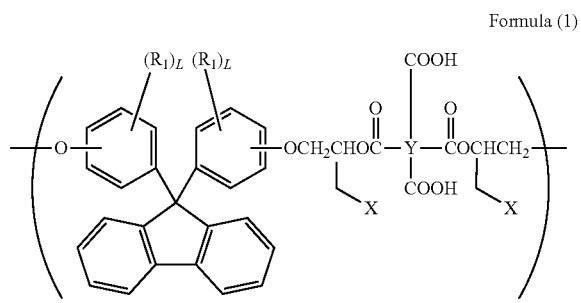

Formula (1)

herein each $R_1$ is independently a $C_{1\text{-}10}$ alkyl group or a halogen atom; each L is an integer of 0 to 4; X is an organic group having an unsaturated bond at a terminal thereof; and Y is a linking group including a portion that is obtained by removing an acid radical from a tetracarboxylic dianhydride.

8 Claims, No Drawings

PHOTOSENSITIVE COMPOSITION INCLUDING PHOTOPOLYMERIZABLE POLYMER HAVING FLUORENE SKELETON

TECHNICAL FIELD

The present invention relates to a negative photosensitive composition that includes a photopolymerizable compound mainly composed of a fluorene skeleton and a fluorene-based low-molecular material, and a planarization film and a microlens containing the same.

BACKGROUND ART

Microlenses for an image sensor such as a charge coupled device (CCD) or LCDs (liquid crystal panels) have been designed to have increased light collection or light extraction efficiency by combining a high refractive index material and a low refractive index material.

For example, the following design is generally adopted. A high refractive index material is used for a planarization film in a charge coupled device (CCD) and a low refractive index material is used for a microlens so as to collect light while preventing reflection. Alternatively, a high refractive index material is used for a microlens so as to collect light even when the lens is far from a diode.

Meanwhile, in recent years, LCDs are shifting toward a larger screen, higher definition, and lower power consumption, which requires the light extraction efficiency of LCDs to be enhanced. A common method to achieve it is to use coating of a low refractive index material to enhance the light extraction efficiency.

In this method, a resist composition containing a polymer resin with a high refractive index and a crosslinkable material with a high refractive index is used to coat a substrate for film formation, and the resultant workpiece is subjected to patterning and development by a photolithography technique to form a pattern, and to obtain a planarization film or a spacer for an LCD. Etching and similar processes are further performed to form a microlens.

It is described that a photosensitive composition that includes a resin obtained by condensing a bisphenol fluorene-type epoxy acrylate and a tetracarboxylic dianhydride is used for a protective layer and an interlayer insulating film in a color filter, a liquid crystal display device, an integrated circuit device, a solid-state image sensor, and the like (Patent Document 1, Patent Document 2, and Patent Document 3).

RELATED ART DOCUMENTS

Patent Documents

Patent Document 1: Japanese Patent Application Publication No. JP-A-2003-176343
Patent Document 2: Japanese Patent Application Publication No. JP-A-2003-165830
Patent Document 3: Japanese Patent Application Publication No. JP-A-2004-35685

DISCLOSURE OF THE INVENTION

Problem to be Solved by the Invention

In recent years, there has been a growing trend among cameras toward higher definition and therefore a higher camera sensitivity is increasingly demanded. Because of this, higher transparency and higher light collection are required of a microlens for a digital still camera. In the case of a microlens for a vehicle-mounted use, heat resistance for a long-term use is further required.

Meanwhile, LCDs are recently shifting toward a larger screen, higher definition, and lower power consumption, which requires the light extraction efficiency to be enhanced. In order to enhance the light extraction efficiency, a low refractive index material is used for the atmosphere side (the outer side of an LCD), a high refractive index material is used for the side of a metal oxide such as ITO, and in addition, a material that has heat resistance for a long-term use and transparency is required.

However, it is difficult for conventional materials to satisfy all these requirements.

A purpose of the present invention is to provide a negative photosensitive composition that includes a fluorene-containing copolymer and a fluorene-based crosslinkable compound, for use as a material for a planarization film, a spacer, and a microlens that satisfies heat resistance and transparency requirements without impairing a refractive index; a solid-state image sensor, a microlens, and a liquid crystal display device that are made using the negative photosensitive composition; and a process for producing an electronic material using the negative photosensitive composition.

Means for Solving the Problem

The present invention provides:

as a first aspect, a negative photosensitive composition including a photopolymerizable polymer (A) having a fluorene skeleton, a monomer (B) having a fluorene skeleton, and a photopolymerization initiator (C);

as a second aspect, the negative photosensitive composition according to the first aspect in which the photopolymerizable polymer (A) having a fluorene skeleton includes a moiety that is soluble in an alkaline developer solution;

as a third aspect, the negative photosensitive composition according to the first aspect in which the photopolymerizable polymer (A) having a fluorene skeleton includes a unit structure of Formula (1):

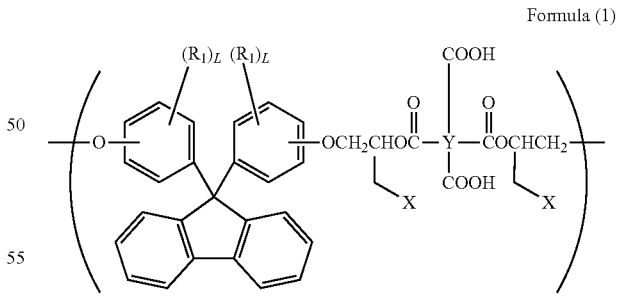

Formula (1)

(where each $R_1$ is independently a $C_{1-10}$ alkyl group or a halogen atom; each L is an integer of 0 to 4; X is an organic group having an unsaturated bond at a terminal thereof; and Y is a linking group including a portion that is obtained by removing an acid radical from a tetracarboxylic dianhydride);

as a fourth aspect, the negative photosensitive composition according to any one of the first aspect to the third aspect in which the monomer (B) having a fluorene skeleton is a compound of Formula (2):

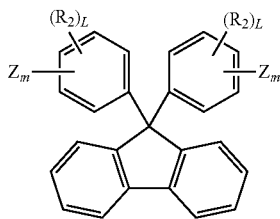

Formula (2)

(where each $R_2$ is independently a $C_{1-10}$ alkyl group or a halogen atom; each L is an integer of 0 to 4; Z is an organic group having an unsaturated bond at a terminal thereof; and each m is an integer of 1 to 5, provided that L+m is an integer of 1 to 5);

as a fifth aspect, the negative photosensitive composition according to any one of the first aspect to the fourth aspect in which X is an organic group of Formula (3):

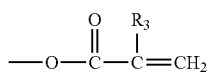

Formula (3)

(where $R_3$ is a hydrogen atom, a methyl group, or an ethyl group);

as a sixth aspect, the negative photosensitive composition according to any one of the first aspect to the fifth aspect in which each Z is independently an organic group of Formula (4), Formula (5), or Formula (6):

Formula (4)

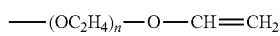

Formula (5)

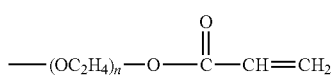

Formula (6)

(where each n is an integer of 0 to 4; and $R_4$ is a hydrogen atom, a methyl group, or an ethyl group);

as a seventh aspect, the negative photosensitive composition according to any one of the first aspect to the sixth aspect in which the photopolymerizable polymer (A) having a fluorene skeleton contains therein 30 mol % or more of a unit structure having a fluorene skeleton;

as an eighth aspect, a solid-state image sensor that is made using the negative photosensitive composition as described in any one of the first aspect to the seventh aspect;

as a ninth aspect, a microlens that is made using the negative photosensitive composition as described in any one of the first aspect to the seventh aspect;

as a tenth aspect, a liquid crystal display device that is made using the negative photosensitive composition as described in any one of the first aspect to the seventh aspect; and as an eleventh aspect, a process for producing the electronic material according to any one of the eighth aspect to the tenth aspect including applying the negative photosensitive composition as described in any one of the first aspect to the seventh aspect onto a substrate, and performing baking, exposure, and development.

Effects of the Invention

The negative photosensitive composition of the present invention can form coating with a high refractive index, resulting in a cured film obtained by heating the coating to have high transparency. The negative photosensitive composition of the present invention can be suitably used as a material for a microlens. It is also suitably used in a planarization film and a photosensitive spacer.

Coating obtained from the negative photosensitive composition of the present invention has a refractive index of 1.6 or more at 633 nm and, in terms of transparency, has transmittance of 80% or more at a wavelength within the range of 400 nm to 730 nm. Using the negative photosensitive composition of the present invention, a solid-state image sensor, a microlens, and a liquid crystal display device, all of which have enhanced light collection and light extraction efficiency, can be made.

The process of the present invention for producing an electronic material using a negative photosensitive composition can produce a solid-state image sensor, a microlens, a liquid crystal display device, and the like, all of which are high in light collection and light extraction efficiency.

BEST MODES FOR CARRYING OUT THE INVENTION

The negative photosensitive composition of the present invention essentially includes the component (A), the component (B), and the component (C), all of which are dissolved in a solvent (D).

In the present invention, a solid content is 3 to 50% by mass and is preferably 5 to 40% by mass. The solid content is a total content of all the components but the solvent in the negative photosensitive composition of the present invention. The content of the polymer (A) in the solid content is 10 to 90% by mass and is preferably 30 to 90% by mass.

The photopolymerizable polymer (A) having a fluorene skeleton has a unit structure of Formula (1).

In Formula (1), each substituent $R_1$ is a $C_{1-10}$ alkyl group or a halogen atom, each L is an integer of 0 to 4, X is an organic group having an unsaturated bond at a terminal thereof, and Y is a divalent linking group obtained by removing an acid radical (namely, a carboxy group) from a tetracarboxylic dianhydride.

Examples of the above X include an organic group exemplified as Formula (3), in which $R_3$ is a hydrogen atom, a methyl group, or an ethyl group.

Examples of the alkyl group include a methyl group, an ethyl group, an n-propyl group, an isopropyl group, a cyclopropyl group, an n-butyl group, an isobutyl group, a sec-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the halogen atom include a fluorine atom, a chlorine atom, a bromine atom, and an iodine atom.

Y is a linking group including a portion that is obtained by removing an acid radical from a tetracarboxylic dianhydride, and examples of the tetracarboxylic dianhydride include, but are not limited to, aromatic tetracarboxylic dianhydride components such as a 2,2-bis(3,4-dicarboxyphenyl)hexafluoroisopropylidene dianhydride, a 4,4'-hexafluoroisopropylidene diphthalic dianhydride, a pyromellitic dianhydride, a 1,2,6,7-naphthalenetetracarboxylic dianhydride, a 3,3',4,4'-biphenyltetracarboxylic dianhydride, a 3,3',4,4'-benzophenonetetracarboxylic dianhydride, a 3,3',4,4'-diphenyl ether tetracarboxylic dianhydride, a 3,4-dicarboxy-1,2,3,4-tetrahydro-1-naphthalenesuccinic dianhydride, and a 2,2-bis(3,4-dicarboxyphenyl)fluorene dianhydride, and cycloaliphatic tetracarboxylic dianhydride components such as a 1,2,3,4-cyclobutanetetracarboxylic dianhydride, a 1,2-dimethyl-1,2,3,4-cyclobutanetetracarboxylic dianhydride, a 1,2,3,4-tetramethyl-1,2,3,4-cyclobutanetetracarboxylic dianhydride, a 1,2,3,4-cyclopentanetetracarboxylic dianhydride, a 1,2,4,5-cyclohexanetetracarboxylic dianhydride, a 5-(2,5-dioxotetrahydrofuryl)-3-methyl-3-cyclohexene-1,2-dicarboxylic dianhydride, a 2,3,5-tricarboxy-2-cyclopentaneacetic dianhydride, a bicyclo[2.2.2]oct-7-ene-2,3,5,6-tetracarboxylic dianhydride, a 2,3,4,5-tetrahydrofurantetracarboxylic dianhydride, and a 3,5,6-tricarboxy-2-norbornaneacetic dianhydride. Particularly preferable are aromatic tetracarboxylic dianhydrides such as a 3,3',4,4'-biphenyltetracarboxylic dianhydride and a 3,3',4,4'-benzophenonetetracarboxylic dianhydride.

Regarding the photopolymerizable polymer (A) having a fluorene skeleton, for example, bisphenol fluorene is subjected to a reaction with epichlorohydrin so that a bisphenol fluorene epoxy compound is produced.

The compound is then subjected to a reaction with an unsaturated carboxylic acid to obtain a bisphenol fluorene-type epoxy acrylate, followed by a reaction with a tetracarboxylic dianhydride so that a condensation polymerization product can be produced.

The polymer (A) basically contains therein 50 mol % of the unit structure having a fluorene skeleton. However, a mixture of a compound in which an epoxy acrylate serving as an intermediate contains no fluorene and a compound in which an epoxy acrylate serving as an intermediate contains fluorene is used to perform a reaction with a tetracarboxylic dianhydride, so that the polymer (A) can contain therein 50 mol % or less of the unit structure having a fluorene skeleton.

Further, an epoxy acrylate that contains the unit structure having a fluorene skeleton is reacted with a tetracarboxylic dianhydride having a fluorene skeleton, so that the polymer (A) can contain therein 50 mol % or more of the unit structure having a fluorene skeleton. Thus, the polymer (A) can contain the unit structure having a fluorene skeleton at not lower than 30 mol %, at 30 to 80 mol %, or at 30 to 100 mol %.

Used as the compound in which an epoxy acrylate serving as an intermediate contains no fluorene can be a product obtained by a reaction of 1,4-dihydroxybenzene or 1,4-dihydroxycyclohexane with epichlorohydrin, followed by a reaction of the reaction product with an unsaturated carboxylic acid (acrylic acid or methacrylic acid, for example).

As the compound of Formula (1), for example, a polymer (Formula (7)) in which X, Y, and L in Formula (1) are a vinylcarbonyloxy group, a biphenyl group, and 0, respectively, can be used.

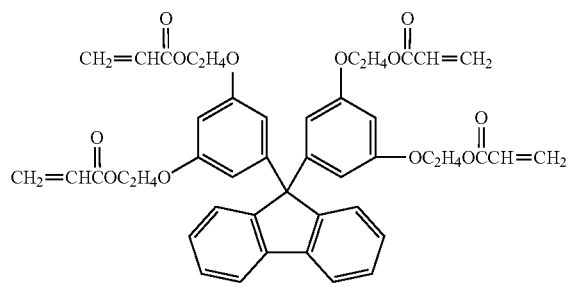

Formula (8)

The monomer (B) can be concurrently used with the following compounds (B') having a polymerizable unsaturated

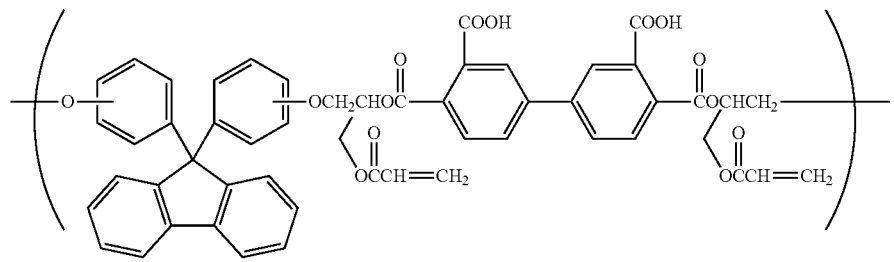

Formula (7)

For such a polymer, a polymer having a weight average molecular weight of within the range of about 2000 to 40000 and preferably about 3000 to 5000 can be used.

As a monomer (B) having a fluorene skeleton that is used in the present invention, a compound of Formula (2) can be used.

In Formula (2), each substituent $R_2$ is a $C_{1-10}$ alkyl group or a halogen atom, each L is an integer of 0 to 4, Z is an organic group having an unsaturated bond at a terminal thereof such as a vinyl group, and m is an integer of 1 to 5. Examples of the organic group include organic groups exemplified as Formula (4) to Formula (6). As the alkyl group and the halogen atom, ones exemplified above can be used.

The addition amount of the monomer (B) is 10 to 200 parts by mass, preferably 20 to 100 parts by mass, and more preferably 30 to 70 parts by mass relative to 100 parts by mass of the polymer (A).

The monomer (B) serves as a crosslinkable compound. The content thereof of 10 parts by mass or less may result in inadequate density of a crosslinking formed by the crosslinkable compound, and therefore an effect of enhancing process resistance after pattern formation such as heat resistance, solvent resistance, and resistance for long-time baking may not be obtained. On the other hand, the content thereof exceeding 200 parts by mass may leave an uncrosslinked crosslinkable compound, which leads to a decrease in resolution or a decrease in process resistance after pattern formation such as heat resistance, solvent resistance, and resistance for long-time baking and, in addition, impairs the storage stability of a photosensitive resin composition.

As the compound of Formula (2), for example, a monomer (Formula (8)) in which Z, m, and L in Formula (2) are —$OC_2H_4$—O—CO—CH=$CH_2$, 2, and 0, respectively can be used. As the compound, a commercially available product can be used.

group. Specific examples thereof include compounds having three polymerizable unsaturated groups in a molecule, such as trimethylolpropane tri(meth)acrylate, pentaerythritol tri (meth)acrylate, dipentaerythritol penta(meth)acrylate, tri (meth)acryloyloxyethoxy trimethylolpropane, and glycerin polyglycidyl ether poly(meth)acrylate, compounds having two polymerizable unsaturated groups in a molecule, such as ethylene glycol di(meth)acrylate, diethylene glycol di(meth) acrylate, tetraethylene glycol di(meth)acrylate, polyethylene glycol di(meth)acrylate, propylene glycol di(meth)acrylate, polypropylene glycol di(meth)acrylate, butylene glycol di(meth)acrylate, neopentyl glycol di(meth)acrylate, bisphenol A-type di(meth)acrylate modified with ethylene oxide, bisphenol di(meth)acrylate modified with propylene oxide, 1,6-hexanediol di(meth)acrylate, glycerin di(meth)acrylate, pentaerythritol di(meth)acrylate, ethylene glycol diglycidyl ether di(meth)acrylate, diethylene glycol diglycidyl ether di(meth)acrylate, diglycidyl phthalate di(meth)acrylate, and hydroxypivalic acid neopentyl glycol di(meth)acrylate, and compounds having a polymerizable unsaturated group in a molecule, such as 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, 3-chloro-2-hydroxypropyl (meth)acrylate, glycerin mono(meth)acrylate, phosphoric acid 2-(meth)acryloyloxyethyl ester, and N-methylol (meth)acrylamide.

When the introduction amount of the crosslinkable compound (B') is within the range of 1 to 100 part(s) by weight relative to 100 parts by weight of the resin component (A), an excellent resist pattern is formed.

The negative photosensitive composition of the present invention includes a photopolymerization initiator (C).

Regarding the photopolymerization initiator (C), materials that generate radicals due to exposure or heat are radical initiators shown below.

The photopolymerization initiator (C) is preferably a photo-radical generator, and examples thereof include organic peroxides such as tert-butylperoxy-isophthalate, 2,5-dimethyl-2,5-bis(benzoyldioxy)hexane, 1,4-bis[α-(tert-butyldioxy)-isopropoxy]benzene, di-tent-butyl peroxide, 2,5-dimethyl-2,5-bis(tert-butyldioxy)hexene hydroperoxide, α-(isopropylphenyl)-isopropyl hydroperoxide, 2,5-dimethylhexane, tert-butyl hydroperoxide, 1,1-bis(tert-butyldioxy)-3,3,5-trimethylcyclohexane, butyl-4,4-bis(tert-butyldioxy) valerate, cyclohexanone peroxide, 2,2',5,5'-tetra(tert-butylperoxycarbonyl)benzophenone, 3,3',4,4'-tetra(tert-butylperoxycarbony)benzophenone, 3,3',4,4'-tetra(tert-amylperoxycarbonyl) benzophenone, 3,3',4,4'-tetra(tert-hexylperoxycarbonyl) benzophenone, 3,3'-bis(tert-butylperoxycarbonyl)-4,4'-dicarboxybenzophenone, tert-butylperoxybenzoate, and di-tert-butyldiperoxyisophthalate, quinones such as 9,10-anthraquinone, 1-chloroanthraquinone, 2-chloroanthraquinone, octamethylanthraquinone, and 1,2-benzanthraquinone, and benzoin derivatives such as methyl benzoin, benzoin ethyl ether, α-methylbenzoin, and α-phenylbenzoin.

Particularly preferable is an oxime ester compound and examples thereof include 1,2-octanedione-1-(4-(phenylthio)-2-(o-benzoyloxime)) and ethanone-1-(9-ethyl-6-(2-methylbenzoyl)-9H-carbazol-3-yl)-1-(o-acetyloxime).

The photopolymerization initiator (C) can be used alone or as a combination of two or more of these. The introduction amount of the photopolymerization initiator (C) is selected from the range of 1 to 200 part(s) by mass and preferably 1 to 100 part(s) by mass relative to 100 parts by mass of the polymer component (A). When the amount thereof is smaller than 1 part by mass, a crosslinking reaction does not adequately proceed and a desired resist pattern is hard to be obtained, and when the amount thereof exceeds 200 parts by mass, a resist composition with poor storage stability is obtained. Therefore, the introduction amount of the photopolymerization initiator is preferably 1 to 200 part(s) by mass relative to 100 parts by mass of the resin component (A).

In addition, a photosensitizer can be optionally used. A conventionally known photosensitizer can be used. Examples thereof include thioxanthene, xanthene, ketone, thiopyrylium salt, base styryl, merocyanine, 3-substituted coumarin, 3,4-substituted coumarin, cyanine, acridine, thiazine, phenothiazine, anthracene, coronene, benzanthracene, perylene, merocyanine, ketocoumarin, fumarin, and borate photosensitizers. The photosensitizer can be used alone or as a combination of two or more of these.

The solvent (D) used in the present invention is not particularly limited provided that it dissolves the component (A), the component (B), and the component (C).

Specific examples of such a solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, propylene glycol monobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, 3-methoxybutyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. The solvent can be used alone or as a combination of two or more of these.

Among these solvents, propylene glycol monomethyl ether, propylene glycol monomethyl ether acetate, ethyl lactate, butyl lactate, and cyclohexanone are preferable to enhance the leveling property of coating.

At least one solvent with a boiling point of not lower than 200° C. can be concurrently used. The solvent with a boiling point of not lower than 200° C. is used preferably at an amount of 1 to 50% by mass and more preferably at an amount of 5% to 40% by mass relative to the total solvent in the negative photosensitive composition. When the amount is 50% by mass or more, an excellent leveling property of coating may be hard to be obtained, and when the amount is 1% by mass or less, the leveling property may not be obtained.

Specific examples of the solvents with a boiling point of 200° C. or more include N-methylpyrrolidone, γ-butyrolactone, diethylene glycol monoethyl ether (ethyl carbitol), diethylene glycol monobutyl ether (butyl carbitol), acetamide, and benzyl alcohol.

To the negative photosensitive composition of the present invention, a surfactant (E) can be added so as to enhance a coating property. The surfactant is not particularly limited, and a fluorine-based surfactant, a silicone-based surfactant, a nonionic surfactant, or the like can be used. As the component (E), the surfactant can be used alone or as a combination of two or more of these. Among these surfactants, a fluorine-based surfactant is preferable for its high effect of enhancing a coating property.

Specific examples of the fluorine-based surfactants include EFTOP EF 301, EF 303, and EF 352 (trade names; manufactured by Tohkem Products Corp.), MEGAFAC F 171, F 173, and R-30 (trade names; manufactured by Dainippon Ink and Chemicals, Inc.), Fluorad FC 430 and FC 431 (trade names; manufactured by Sumitomo 3M Limited), and AsahiGuard AG 710 and Surflon S-382, SC 101, SC 102, SC 103, SC 104, SC 105, and SC 106 (trade names; manufactured by ASAHI GLASS CO., LTD.). However, the fluorine-based surfactant is not limited to these.

The addition amount of the component (E) in the negative photosensitive composition of the present invention is 0.01 to 5 parts by mass, preferably 0.01 to 3 parts by mass, and more preferably 0.01 to 2 parts by mass, relative to 100 parts by mass of the component (A). When the addition amount of the surfactant exceeds 5 parts by mass, non-uniform coating may be obtained, and when the addition amount is smaller than 0.01 parts by mass, the addition is not effective and a striation or the like may appear in coating.

To the negative photosensitive composition of the present invention, an adhesion promoter (F) can be added for enhancing adhesion to a substrate after development.

Specific examples of the adhesion promoter include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, γ-methacryloxypropyltrimethoxysilane, γ-glycidoxypropyltrimethoxysilane, and γ-(N-piperidinyl)propyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, and urea and thiourea compounds such as 1,1-dimethylurea and 1,3-dimethylurea.

As the component (F), the adhesion promoter can be used alone or as a combination of two or more of these. The addition amount of the adhesion promoter (F) is usually 20 parts by mass or less, preferably 0.01 to 10 parts by mass, and more preferably 0.5 to 10 parts by mass, relative to 100 parts by mass of the component (A). When the amount is 20 parts by mass or more, heat resistance of coating may decrease, and when the amount is smaller than 0.1 parts by mass, an effect of the adhesion promoter may not be adequately obtained.

To the negative photosensitive composition of the present invention, another component (G) can be added, where appropriate, provided that the component (G) does not impair the effects of the present invention. As the other component (G), a pigment, a dye, a storage stabilizer, an antifoaming agent, a dissolution promoter such as a polyphenol and a polycarboxylic acid, or the like may be added.

The negative photosensitive composition of the present invention includes the component (A), the component (B), the component (C), and the solvent (D). In addition to the component (A), the component (B), the component (C), and the solvent (D), the composition can include one or more of the components (E) to (G), where appropriate.

A production process of the present invention using a dye-containing negative composition is described below.

The negative photosensitive composition of the present invention is applied onto a silicon wafer or a glass substrate by a spinner method or a similar method at a rotational speed that achieves a desired film thickness, followed by soft-baking (baking). Soft-baking is performed only to evaporate a solvent and is preferably performed at a temperature within the range of 50 to 150° C. for 30 seconds to 10 minutes. Subsequently, exposure is performed through a mask at an exposure amount of about 10 to 1000 mJ/cm². For exposure, ultraviolet light generated by a mercury lamp or the like, far-ultraviolet light, an electron beam, an X-ray, or the like is used, for example.

Next, development is performed. The method for development is not particularly limited and can be a known method such as puddling, dipping, and spraying. The development temperature is preferably between 20° C. and 30° C., and immersion in a developer solution for 10 seconds to 10 minutes is preferable. As the developer solution, an organic solvent, an aqueous alkaline solution, or the like can be used. Specific examples thereof include isopropyl alcohol, propylene glycol monomethyl ether, an aqueous ethylamine solution, an aqueous n-propylamine solution, an aqueous diethylamine solution, an aqueous di-n-propylamine solution, an aqueous triethylamine solution, an aqueous methyldiethylamine solution, an aqueous diethanolamine solution, an aqueous triethanolamine solution, an aqueous tetramethylammonium hydroxide solution, an aqueous sodium hydroxide solution, an aqueous potassium hydroxide solution, an aqueous sodium carbonate solution, an aqueous sodium hydrogen carbonate solution, an aqueous sodium silicate solution, and an aqueous sodium metasilicate solution. Excessive alkaline components render development performance too strong, which allows the developer solution to permeate even through an exposed portion in the case of a negative photosensitive composition and therefore tends to cause roughness on a pattern surface, and insufficient alkaline components result in no development performance to be obtained. Excessive surfactant components allow the developer solution to readily foam and therefore tend to cause development to be rather uneven. On the other hand, insufficient surfactant components result in no development performance to be obtained.

After development, it is preferable to rinse with water or a typical organic solvent. Subsequently, drying is performed to form a pattern. In the case where a negative photosensitive composition is used, a negative pattern is formed in which an exposed portion is cured and an unexposed portion is dissolved. Then, post-baking is performed so as to facilitate crosslinking or to remove any remaining solvent. Post-baking is preferably performed at a temperature within the range of 150 to 500° C. for 1 minute to 2 hours.

EXAMPLES

Example 1

5.42 g of the polymer of Formula (7) (weight average molecular weight: 3500) as the polymer (A) and 16.06 g of propylene glycol monomethyl ether acetate as the solvent (D) were placed in a 50-ml eggplant-type flask, followed by stirring the mixture at room temperature. No insoluble matter was confirmed in the reaction solution and therefore the solution was uniform.

Subsequently, 1.70 g of the monomer of Formula (8) as the monomer (B) that serves as a crosslinkable compound, 0.43 g of a photo-radical initiator "IRGACURE OXE01" (manufactured by Ciba Specialty Chemicals, oxime ester-based) as the photopolymerization initiator (C), and 0.086 g of MEGAFAC R-30 (manufactured by Dainippon Ink and Chemicals, Inc.) as the surfactant (E) were added thereto, followed by further stirring the reaction solution at room temperature to obtain a photosensitive composition (1). No insoluble matter was confirmed in the solution and therefore a uniform solution was obtained.

When a portion of the solution was filtrated using a 0.20 μm filter and the resultant filtrate was left in a previously washed sample bottle at room temperature for 1 week, no contaminant was confirmed by visual observation.

The photosensitive composition (1) was filtrated using a 0.20 μm filter and the resultant filtrate was left in a previously washed sample bottle for 2 days. Subsequently, using a spin coater, the composition was applied onto a silicon wafer that was treated with hexamethylsilazane (hereinafter, called HMDS) at 100° C. for 1 minute. Baking (soft-baking) was performed at 100° C. for 1 minute on a hot plate to form coating with a film thickness of 3.5 μm. The coating was irradiated, using an ultraviolet irradiation device PLA-501(F) (manufactured by Canon Inc.), with ultraviolet light that had an irradiation amount at 365 nm of 150 mJ/cm². Subsequently, development was performed with immersion in an NMD-3 developer solution (manufactured by TOKYO OHKA KOGYO CO., LTD.) at 23° C. for a certain period of time, followed by washing the workpiece with running ultra-pure water. After development, a contact hole of 10 μm was resolved, with no residue remaining. Subsequently, post-baking was performed at 220° C. for 3 minutes on a hot plate to obtain a cured film. On the cured film formed on the silicon wafer, no contaminant was confirmed by visual observation under a sodium lamp. By observation with an optical microscope, no contaminant was confirmed. When a glass substrate was used and evaluation was performed in the same manner as above, a similar cured film was obtained.

The obtained cured film was evaluated for the following items.

(1) Refractive Index:

The refractive index of the obtained cured film was measured at 635 nm with a DUV ellipsometer. The refractive index was 1.61 at a wavelength of 633 nm.

(2) Transmittance

The transmittance of the obtained cured film that was measured with UV-2550 was 94%.

Comparative Example 1

The same procedures as in Example 1 were performed except that the whole of the monomer of Formula (8) as the monomer (B) in Example 1 was changed to dipentaerythritol.

(1) Refractive Index:

The refractive index of the obtained cured film was measured at 635 nm with a DUV ellipsometer. The refractive index was 1.59 at a wavelength of 633 nm.

(2) Transmittance

The transmittance of the obtained cured film that was measured with UV-2550 was 94%.

Comparative Example 2

The same procedures as in Example 1 were performed except that the whole of the monomer of Formula (8) as the monomer (B) in Example 1 was not used.

(1) Refractive Index:

The refractive index of the obtained cured film was measured at 635 nm with a DUV ellipsometer. The refractive index was 1.59 at a wavelength of 633 nm.

(2) Transmittance

The transmittance of the obtained cured film that was measured with UV-2550 was 93%.

INDUSTRIAL APPLICABILITY

A cured film obtained from the negative photosensitive composition of the present invention is a material that is ready for use in designing finer solid-state image sensors and satisfies a weather resistance requirement for vehicle-mounted and similar uses, and a material that enhances the light extraction efficiency of an LCD. In other words, the cured film is excellent in a refractive index, heat resistance, and transparency. It can be applied to a solid-state image sensor, an LCD, and the like.

The invention claimed is:

1. A negative photosensitive composition comprising:

a photopolymerizable polymer (A) having a fluorene skeleton, the photopolymerizable polymer (A) having a fluorene skeleton including a unit structure of Formula (1):

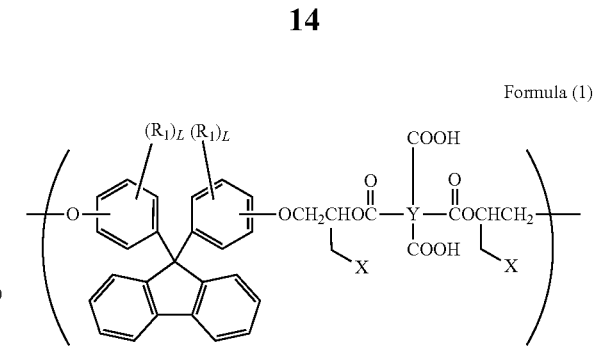

Formula (1)

where each $R_1$ is independently a $C_{1-10}$ alkyl group or a halogen atom; each L is an integer of 0 to 4; X is an organic group having an unsaturated bond at a terminal thereof; and Y is a linking group including a portion that is obtained by removing an acid radical from a tetracarboxylic dianhydride;

a monomer (B) having a fluorene skeleton; and a photopolymerization initiator (C).

2. The negative photosensitive composition according to claim 1, wherein the monomer (B) having a fluorene skeleton is a compound of Formula (2):

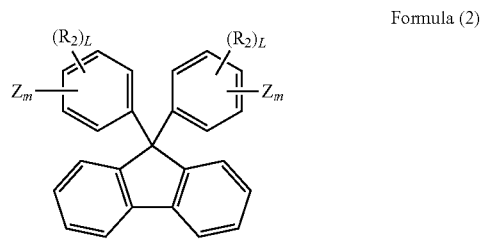

Formula (2)

where each $R_2$ is independently a $C_{1-10}$ alkyl group or a halogen atom; each L is an integer of 0 to 4; Z is an organic group having an unsaturated bond at a terminal thereof; and each m is an integer of 1 to 5, provided that L+m is an integer of 1 to 5.

3. The negative photosensitive composition according to claim 1, wherein X is an organic group of Formula (3):

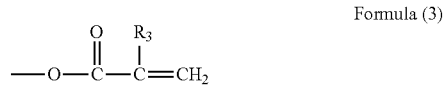

Formula (3)

where $R_3$ is a hydrogen atom, a methyl group, or an ethyl group.

4. The negative photosensitive composition according to claim 2, wherein each Z is independently an organic group of Formula (4), Formula (5), or Formula (6):

Formula (4)

Formula (5)

-continued

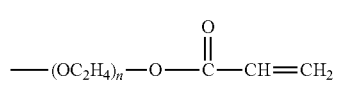
Formula (6)

where each n is an integer of 0 to 4; and $R_4$ is a hydrogen atom, a methyl group, or an ethyl group.

5. The negative photosensitive composition according to claim 1, wherein the photopolymerizable polymer (A) having a fluorene skeleton contains therein 30 mol % or more of a unit structure having a fluorene skeleton.

6. A solid-state image sensor that is made using the negative photosensitive composition as claimed in claim 1.

7. A microlens that is made using the negative photosensitive composition as claimed in claim 1.

8. A liquid crystal display device that is made using the negative photosensitive composition as claimed in claim 1.

* * * * *